(12) United States Patent
Kwon et al.

(10) Patent No.: US 8,367,278 B2
(45) Date of Patent: Feb. 5, 2013

(54) HALFTONE MASK AND MANUFACTURING METHOD THEREOF AND METHOD FOR FORMING FILM USING THE SAME

(75) Inventors: Oh-Seob Kwon, Yongin (KR); Jae-Yong Kim, Yongin (KR); Sung-Chul Kim, Yongin (KR); Kyoung-Bo Kim, Yongin (KR); Il-Jeong Lee, Yongin (KR); Cheol-Ho Yu, Yongin (KR); Yong-Woo Park, Yongin (KR); Han-Hee Yoon, Yongin (KR); In-Young Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 236 days.

(21) Appl. No.: 12/824,086

(22) Filed: Jun. 25, 2010

(65) Prior Publication Data

US 2010/0330468 A1 Dec. 30, 2010

(30) Foreign Application Priority Data

Jun. 25, 2009 (KR) ........................ 10-2009-0056941

(51) Int. Cl.
*G03F 1/32* (2012.01)
(52) U.S. Cl. .......................................................... 430/5
(58) Field of Classification Search .............. 430/5, 322, 430/311, 394; 349/141
See application file for complete search history.

(56) References Cited

U.S. PATENT DOCUMENTS

| 2007/0031737 A1* | 2/2007 | Schroeder et al. ................ 430/5 |
| 2009/0042106 A1 | 2/2009 | Nagamura et al. |
| 2009/0176325 A1* | 7/2009 | Jeon et al. ....................... 438/34 |

FOREIGN PATENT DOCUMENTS

| KR | 10-0669457 | 1/2007 |
| KR | 10-0708734 | 4/2007 |
| KR | 20070101902 A | 10/2007 |
| KR | 20080054176 A | 6/2008 |

OTHER PUBLICATIONS

Korean Office Action issued by KIPO, dated Jan. 21, 2011, corresponding to Korean Patent Application No. 10-2009-0056941, together with Request for Entry.
Notice of Allowance issued by KIPO on Sep. 20, 2011 in connection with Korean Patent Application Serial No. 10-2009-0056941 and Request for Entry of the Accompanying Office Action attached herewith.

\* cited by examiner

*Primary Examiner* — Stephen Rosasco
(74) *Attorney, Agent, or Firm* — Robert E. Bushnell, Esq.

(57) ABSTRACT

Embodiments relate to halftone masks that can uniformly form the height of an underlying layer in two regions that are spaced apart from each other, a manufacturing method thereof, and a method for forming a film using the same. The halftone mask includes a first light blocking unit and a second light blocking unit, and a semi-transmitting unit that is disposed adjacent to the side of the second light blocking unit. The first and second light blocking units block light and are spaced apart from each other at a predetermined interval. The semi-transmitting unit is positioned at a side far from the first light blocking unit and reduces intensity of light. Sum of the second length of the second light blocking unit and the third length of the semi-transmitting unit is larger than the first length of the first blocking unit.

21 Claims, 12 Drawing Sheets

HALFTONE MASK AND MANUFACTURING METHOD THEREOF AND METHOD FOR FORMING FILM USING THE SAME

CLAIM OF PRIORITY

This application makes reference to, incorporates the same herein, and claims all benefits accruing under 35 U.S.C. §119 from an application earlier filed in the Korean Intellectual Property Office on 25 Jun. 2009 and there duly assigned Serial No. 10-2009-0056941.

BACKGROUND OF THE INVENTION

1. Field of the Invention

Embodiment relates to a halftone mask, and more particularly, to a halftone mask that can uniformly form the heights of underlying layers in two regions spaced from each other, a manufacturing method thereof and a method for forming a film using the same.

2. Discussion of Related Art

An organic light emitting display device has advantages in view of rapid response speed as well as wide view angle and excellent contrast so that it has been spotlighted as a next generation flat panel display device.

In manufacturing the organic light emitting display device, the integration of a panel and a driving circuit is very important for the lightweight and slimness and the reduction in production costs of the panel. For example, with a manufacturing process using a low temperature poly silicon (LTPS) technology, the number of masks is reduced, making it possible to enhance the productivity of the device and to seek for the cost reduction thereof.

One of the methods to reduce the number of masks is to use a halftone mask. If the halftone mask is used, pixel defining layers that cover a pixel electrode to expose some regions of the pixel electrode of the organic light emitting display device can be patterned using one mask.

However, when the pixel defining layers are patterned using one mask, a height difference is generated between the regions of the pixel defining layers on left and right sides of the exposed pixel electrode so that it may cause a defect in a subsequent process.

For example, the height difference between the regions of the pixel defining layers on both sides of the pixel electrode may cause a defect in an organic deposition such as a light emission layer, etc. or in a metal deposition such as an electrode layer, etc. Further, the pixel defining layer also functions as a spacer when masks for depositing the organic material or the electrode, etc. are attached but in that case, the masks get loose in some regions so it may cause a defect in deposition.

SUMMARY OF THE INVENTION

Embodiments provide halftone masks that can uniformly form the heights of underlying layers in two regions spaced from each other, and a manufacturing mask thereof. Further, an embodiment provides a method for forming a film that can enhance productivity and reduce manufacturing costs using the halftone mask.

According to one aspect of the present invention, there is provided a halftone mask including a first light blocking unit having a first length and blocking light, a second light blocking unit having a second length and blocking light, and a first semi-transmitting unit having a third length. The first and second light blocking units are spaced apart lengthwise from each other at a predetermined interval. The first semi-transmitting unit is disposed substantially next to the second light blocking unit in a manner that the second light blocking unit is disposed between the first semi-transmitting unit and the first light blocking unit. The first semi-transmitting unit reduces intensity of light passing through the halftone mask. Sum of the second length and the third length is larger than the first length.

The third length may be determined in an inverse proportion to the first length of the first light blocking unit while maintaining the sum of the second length and the third length. The first length and the third length may have a relationship of $W1 = A \cdot W3 + B$, where $W1$ is the first length, $W3$ is the third length, $A$ is a number in a range from $-0.68$ to $-1.43$, and $B$ is a number in a range from 12 to 23.

The halftone mask may include a light transmitting unit transmitting light or a second transmitting unit disposed between the first light blocking unit and the second light blocking unit.

The first semi-transmitting unit may be made of the same material as the second light blocking unit, the first semi-transmitting unit having slits, light passing through the slits.

Each of the first light blocking unit and the second light blocking unit may include a light shielding layer disposed on a transparent base. The light shielding layer may include chrome (Cr) or chrome oxide. The semi-transmitting unit may include CrxOy, CrxCoy, CrxCoyNz, SizNy, or combinations thereof (herein, suffix x, y, and z are natural numbers, each representing the number of chemical elements).

According to another aspect of the present invention, there is provided a manufacturing method of a halftone mask, including forming a first light blocking unit having a first length and a second light blocking unit having a second length, and forming a first semi-transmitting unit having a third length. The first and second light blocking units block light. The first and second light blocking units are spaced apart lengthwise from each other at a predetermined interval. The first semi-transmitting unit is disposed substantially next to the second light blocking unit in a manner that the second light blocking unit is disposed between the first semi-transmitting unit and the first light blocking unit. The first semi-transmitting unit reduces intensity of light passing through the halftone mask. Sum of the second length and the third length being larger than the first length.

The third length may be determined in an inverse proportion to the first length while maintaining the sum of the second length and the third length.

The first semi-transmitting unit may include slits through which light passes.

The forming the first light blocking unit and the second light blocking unit may include forming a light shielding layer on a transparent base.

According to still another aspect of the present invention, there is provided a method for forming a film using a halftone mask including arranging the halftone mask on a underlying layer formed on a substrate, emitting light to the underlying layer through the halftone mask; and developing the underlying layer. The halftone mask includes a first light blocking unit having a first length and blocking light, a second light blocking unit having a second length and blocking light, and a first semi-transmitting unit having a third length. The first and second light blocking units are spaced apart lengthwise from each other at a predetermined interval. The first semi-transmitting unit is disposed substantially next to the second light blocking unit in a manner that the second light blocking unit is disposed between the first semi-transmitting unit and the first light blocking unit. The first semi-transmitting unit reduces intensity of light passing through the halftone mask.

Sum of the second length and the third length is larger than the first length. A first height of a first portion of the underlying layer corresponding to the first light blocking unit and a second height of a second portion of the underlying layer corresponding to the second light blocking unit are substantially the same.

The underlying layer may be made of photosensitive polymer material.

The film includes a pixel defining layer that covers the upper part of a substrate on which a pixel electrode is formed so that a portion of the pixel electrode of an organic light emitting display device is exposed.

With the embodiment, the heights of two underlying layers spaced to each other corresponding to the regions of the two light blocking units of the mask can be formed uniformly. For example, in the manufacturing process of the organic light emitting display device, the heights of the pixel defining layers can be formed uniformly, while reducing the number of masks. Further, the generation of the defect during the subsequent process is prevented using the pixel defining layers having the uniform height, making it possible to enhance the productivity of the organic light emitting display device and to reduce the manufacturing costs thereof.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
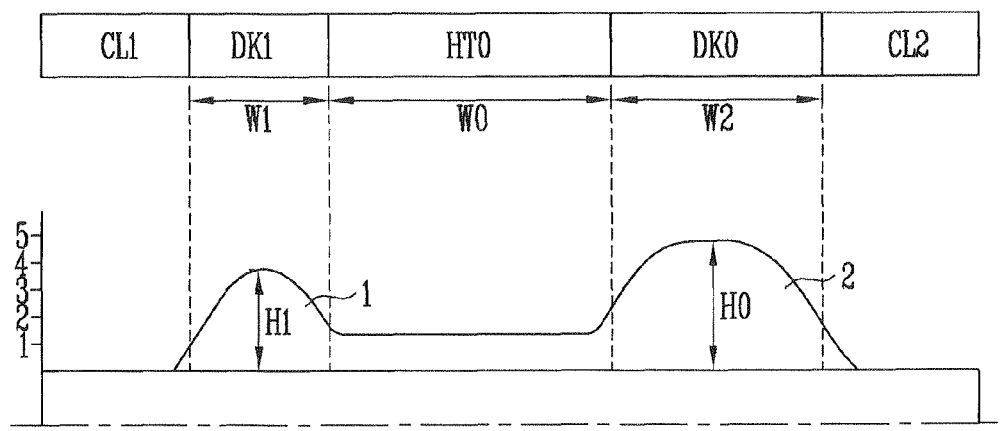
FIG. 1 is a diagram explaining a mask layout compared with an embodiment of the present invention and a underlying layer formed using the mask.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements. In the drawings, the thickness or size of the respective constituents may be exaggerated for the convenience and clarity of explanation.

Hereinafter, exemplary embodiments of the present invention, proposed so that a person having ordinary skill in the art can easily carries out the present invention, will be described in more detailed with reference to the accompanying drawings.

FIG. 1 is a diagram explaining a mask layout compared with an embodiment of the present invention and an underlying layer formed using the mask. Referring to FIG. 1, the mask according to the present comparative example includes two light blocking units DK1 and DK0, a semi-transmitting unit HT0 between the two light blocking units DK1 and DK0, and two light transmitting units CL1 and CL2 positioned at both outsides of the two light blocking units DK1 and DK0. The two light blocking units include one light blocking unit DK1 having a first length W1 in one direction and the other light blocking unit DK0 spaced apart from the light blocking unit DK1 at a predetermined interval and having a second length W2.

When patterning the underlying layer on a substrate structure using the mask according to the present comparative example, if the first length W1 is different from the second length W2, for example, if the second length W2 is larger than the first length W1, the thickness H0 of a portion 2 of the underlying layer formed in the region corresponding to the light blocking unit DK0 becomes larger than the thickness H1 of a portion 1 of the underlying layer formed in the region corresponding to the light blocking unit DK1.

As described above, if the thicknesses of the underlying layers in the regions corresponding to the two light blocking units of the mask, which are spaced apart from each other, are different from each other when forming the underlying layers using the mask, defects may be easily generated in depositing a film having a desired thickness or pattern, etc.

For example, pixel defining layers that cover a pixel electrode to expose some regions of the pixel electrode of an organic light emitting display device may be patterned using one halftone mask, and at that time, a height (thickness) difference may be generated between the regions of the pixel defining layers on left and right sides of the exposed pixel electrode. In that case, the height difference between the regions of the pixel defining layers on the left and right sides of the pixel electrode may cause a defect in an organic deposition such as a light emission layer, etc. or in a metal deposition such as an electrode layer, etc. Further, the pixel defining layer also functions as a spacer when masks for depositing the organic material or the electrode, etc. are attached but in that case, the masks get loose in some regions so it may cause a defect in deposition.

Figure 2:
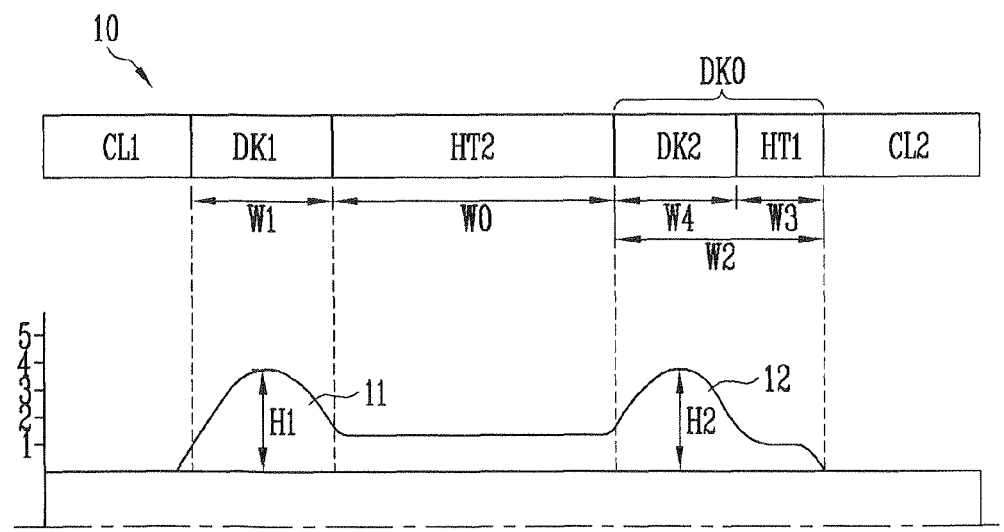
FIG. 2 is a diagram explaining a halftone mask layout according to an embodiment of the present invention and a underlying layer formed using the halftone mask.

FIG. 2 is a diagram explaining a halftone mask layout according to an embodiment of the present invention and an underlying layer formed using the halftone mask. Referring to FIG. 2, the halftone mask according to the present embodiment includes two light blocking units DK1 and DK2 that are spaced apart from each other in one direction, a semi-transmitting unit HT2 disposed between the two light blocking units DK1 and DK2, and two light transmitting units CL1 and CLS that are disposed at either outside of the two light blocking units DK1 and DK2. Another semi-transmitting unit HT1 is disposed between the light blocking unit DK2 and the light transmitting unit CL2.

The light blocking unit DK1 and DK2 blocks light not to allow the light to reach the lower regions of the mask corresponding to the light blocking units. The semi-transmitting units HT1 and HT2 serves to allow a reduced amount of light to reach the lower regions of the mask corresponding to the semi-transmitting units by partially blocking light or attenuating the intensity of light. The light transmitting units CL1 and CL2 substantially transmit light.

Herein, the underlying layer may be made of polymer material having photosensitive properties, while having electrically sufficient insulating effects such as photoresist, polyimide, and silicon nitride. For example, the underlying layer may be made of the polymer material including photo active compound (PAC) material, wherein the PAC is changed into carboxylic acid when exposed to light. The carboxylic acid is neutralized when exposed to an alkaline developer. In other words, if the underlying layer is made of the polymer material having the photosensitive properties, the underlying layer having a desired pattern can be formed through an exposure process and a development process.

An intensity of light in a predetermined wavelength range is reduced while passing through the semi-transmitting unit HT1 of the halftone mask. Accordingly, the thickness of the underlying layer corresponding to the semi-transmitting unit HT1 is different from the thickness of the underlying layer corresponding to the light blocking unit DK2 after the lithography process. However, if the semi-transmitting unit HT1 is disposed adjacent to the light blocking layer DK2 as shown in FIG. 2, a portion of the underlying layer corresponding to the light blocking unit DK2 flows to a portion of the underlying layer corresponding to the semi-transmitting unit HT1 so that the height of the portion of the underlying layer corresponding to the light blocking unit DK2 is lowered. In other words, if the semi-transmitting unit HT1 is disposed adjacent to the light blocking layer DK2, the height of the underlying layer of the light blocking unit DK2 can be lowered due to the factors such as diffraction of light used in the exposure process, the flow of the underlying layer, the shrinkage of the underlying layer, etc.

In a mask that has two light blocking units DK1 and DK0 spaced from each other in one direction (for example, in direction parallel to a straight line passing the two light blocking units DK1 and DK0) and having different lengths, if the length W2 of one light blocking unit DK0 is larger than the length W1 of the other light blocking unit DK1, the difference of the lengths causes the aforementioned problem that the heights of the regions of the two underlying layers corresponding to the two light blocking units DK1 and DK0 are different. In the present embodiment, in order to solve this problem a portion of the light blocking unit DK0, whose length W2 is larger than the length W1 of another light blocking unit DK1, is replaced by a semi-transmitting unit HT1.

In other words, in the present invention, a portion of the light blocking unit DK0, having a relatively larger length than another light blocking units DK1, is replaced by the semi-transmitting unit HT1. The length of the semi-transmitting unit HT1 is determined in a manner that the heights H1 and H2 of the regions of the two underlying layers 11 and 12 corresponding to the two light blocking units DK1 and DK2, respectively, after the lithography process, become substantially the same.

Hereinafter, the rest of the light blocking unit DK0, which is not replaced by the semi-transmitting unit HT1, is referred to as a second light blocking unit DK2. The length of the first light blocking unit DK1 is referred to as a first length W1. The sum of the length of the second light blocking unit DK2 and the length of the semi-transmitting unit HT1 is referred to as a fourth length W2. The length of the semi-transmitting unit HT1 is referred to as a third length W3, and the length of the second light blocking unit DK2 is referred to as a second length W4. In the present embodiment, the fourth length W2 is larger than the first length W1.

Figure 3A:
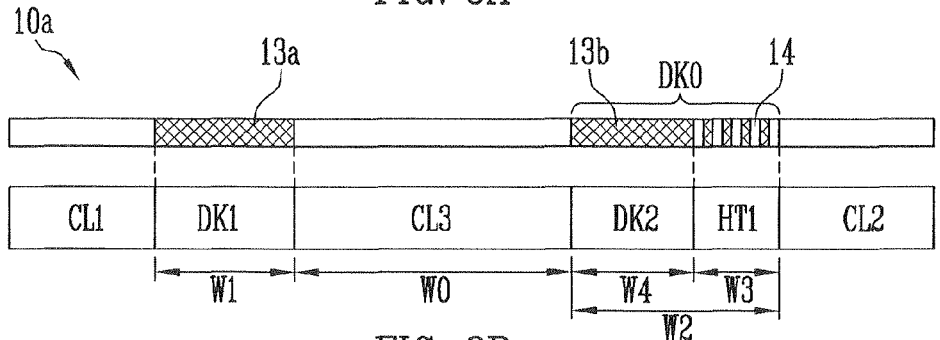
FIGS. 3A to 3D are diagrams explaining halftone masks adoptable to the present invention.

FIGS. 3A to 3D are cross-sectional views explaining halftone masks adoptable to the present invention. Referring to FIG. 3A, a halftone mask 10a of the present embodiment includes a first light blocking unit DK1 (or 13a) having a first length W1 and blocking light, a second light blocking unit DK2 (or 13b) having a second length W4 and blocking light, and a first semi-transmitting unit HT1 having a third length W3. The first and second light blocking units DK1 and DK2 are spaced apart lengthwise from each other at a predetermined interval. The first semi-transmitting unit HT1 is disposed substantially next to the second light blocking unit DK2 in a manner that the second light blocking unit DK2 is disposed between the first semi-transmitting unit HT1 and the first light blocking unit DK1. Herein, the meaning of the "substantially next to" is that the first semi-transmitting unit HT1 is disposed very close to the second light blocking unit DK2 so that only a negligible gap or no gap is allowed between the first semi-transmitting unit HT1 and the second light blocking unit DK2. Herein the negligible gap means a gap (or interval) that is determined in a manner that the heights of the underlying layers corresponding to the second light blocking unit DK2 and the semi-transmitting unit HT1 are, after lithography process, substantially the same. This gap is described in detail later referring to FIG. 3C.

The first light blocking unit DK1 and the second blocking unit DK2 of the halftone mask 10a correspond to portions 13a and 13b on which metallic material exists. The first semi-transmitting unit HT1 corresponds to a portion on which slits 14 are formed between metallic materials (slit structure or slit pattern portion). Light passes through the slits 14, but overall intensity of the light passing through the first semi-transmitting unit HT1 is reduced. The light transmitting units CL1, CL2, and CL3 correspond to portions on which metallic material is not formed. The light transmitting unit CL3 is formed between the first light blocking unit DK1 and the second light blocking unit DK2 of the halftone mask 10a. The light transmitting units CL1, CL2, and CL3 transmit light.

Figure 3B:
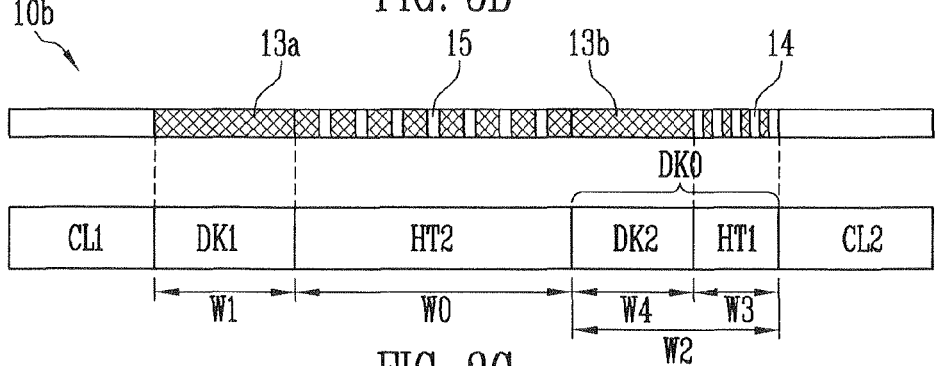

Referring to FIG. 3B, a halftone mask 10b of the present embodiment is substantially the same as the halftone mask 10a explained with reference to FIG. 3A, excepting for the feature that a second semi-transmitting unit HT2 is provided between the first light blocking unit DK1 and the second light blocking unit DK2. The second semi-transmitting unit HT2 corresponds to a portion on which slits 15 are formed between metallic materials. Light passes through the slits 15, but overall intensity of the light passing through the second semi-transmitting unit HT2 is reduced.

The transmittances of the first and second semi-transmitting units HT1 and HT2 may be the same or be different. If the transmittances of the first and second semi-transmitting units HT1 and HT2 are different, a thickness of an underlying layer corresponding to a semi-transmitting unit having a lower transmittance may be smaller that a thickness of another underlying layer of the semi-transmitting unit having a higher transmittance. If the transmittances of the first and second semi-transmitting units HT1 and HT2 are the same, the thicknesses of regions of the corresponding underlying layers are the same, such that they may be etched to be removed during a subsequent process.

The halftone masks 10a and 10b explained with reference to FIGS. 3A and 3B may be provided by forming the semi-transmitting unit HT1 having slits 14 in one portion of the light blocking unit DK0 having a relatively longer length among two light blocking units DK1 and DK0, which are spaced from each other and having different lengths in one direction in the metallic structure that forms a body of the halftone mask. The slits 14 may be formed through a metal processing process such as a molding and/or a cutting process, etc.

Figure 3C:
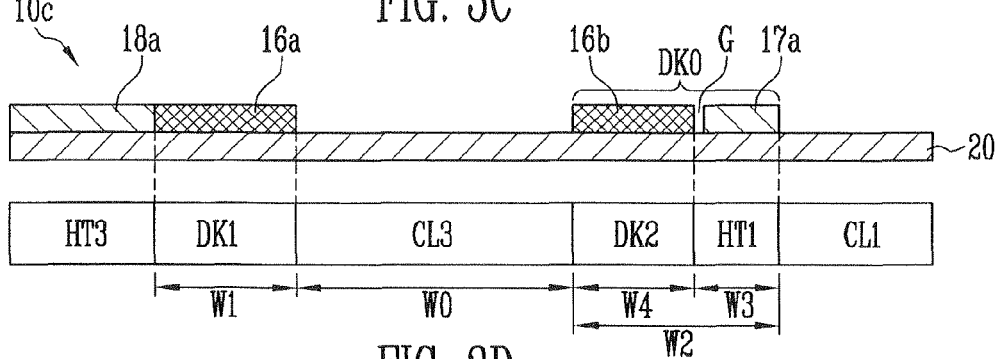

Referring to FIG. 3C, a halftone mask 10c of the present embodiment includes a first light blocking unit DK1 (16a) having a first length W1 in a lengthwise direction, a second light blocking unit DK2 (16b) spaced apart lengthwise from the first light blocking unit 16a and having a second length W2, a first semi-transmitting unit HT1 (17a) disposed adjacent to one side of the second light blocking unit 16b, which is a side of the second light blocking unit 16b positioned far away from the first light blocking unit 16a in the lengthwise direction.

The semi-transmitting unit 17a is formed to be spaced apart from the one side of the second light blocking unit 16b at a predetermined interval G. The size of the predetermined interval G is determined in a manner that the heights of the profile of the underlying layers corresponding to the second light blocking unit 16b and the semi-transmitting unit 17a respectively, are not substantially changed. In other words, the semi-transmitting unit 17a may be formed to contact the second light blocking unit 16b or may be formed to be spaced apart from the second light blocking unit 16b at the predetermined interval G.

The halftone mask 10c includes a third semi-transmitting unit HT3 (18a). The third semi-transmitting unit 18a is formed to contact one side of the first light blocking unit 16a, which is a side of the first light blocking unit 16a positioned far away from the second light blocking unit 16b in the lengthwise direction.

The first light blocking unit 16a and the second light blocking unit 16b are formed of a light shielding layer (or a light shielding pattern) on a transparent base 20. The light shielding layer includes a material and a structure not transmitting light. The light shielding layer may be made of chrome (Cr) or chrome oxide. The transparent base 20 completely transmits light in a predetermined wavelength range. The transparent base 20 may be made of quartz.

The semi-transmitting units 17a and 18a may be formed by disposing a predetermined material on the transparent base 20. The semi-transmitting units 17a and 18a may be made of at least any one of CrxOy, CrxCoy, CrxCoyNz, SizNy (herein, suffix x, y, and z are natural numbers, each representing the number of chemical elements), preferably, chrome (CrxOy) including oxygen.

In the halftone mask 10c of the present embodiment, when one portion of the light blocking unit DK0 having a relatively larger length among two different lengths W1 and W2 of the two light blocking units DK1 and DK0 is replaced by the semi-transmitting unit 17a, the third length W3 of the semi-transmitting unit 18a in the present embodiment may be further adjusted in consideration of the third semi-transmitting unit HT3 contacting the light blocking unit DK1 having a relatively smaller length. For example, if the height of the underlying layer of the first light blocking unit DK1 is lowered by the third semi-transmitting unit 18a, the third length W3 of the first semi-transmitting unit 17a can be increased.

Figure 3D:
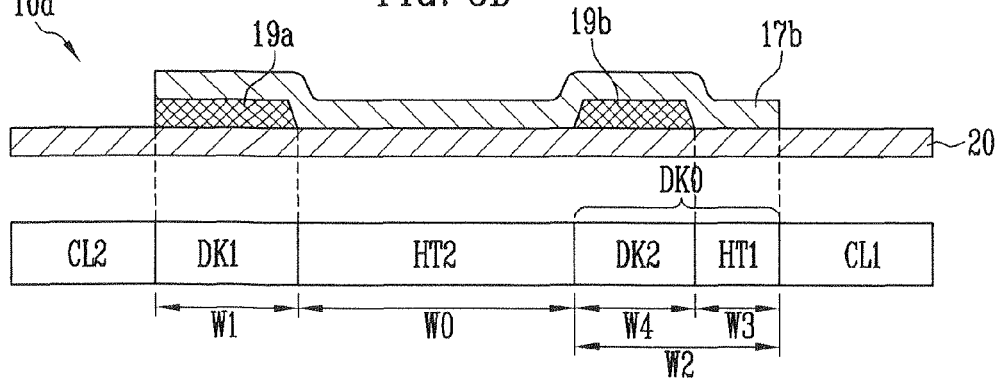

Referring to FIG. 3D, a halftone mask 10d of the present embodiment includes a first light blocking unit DK1 (19a) and a second light blocking unit DK2 (19b) formed on a transparent base 20, and first and second semi-transmitting units HT1 and HT2 formed on the transparent base 20. The first semi-transmitting unit HT1 is formed to contact one side of the second light blocking unit 19b, which is a side positioned far away from the first light blocking unit 19a, and the second semi-transmitting unit HT2 is formed between the first light blocking unit 19a and the second light blocking unit 19b.

The first and second light blocking units 19a and 19b may be provided by forming a light shielding layer on the transparent base 20 made of quartz, etc. and patterning the formed light shielding layer. The light shielding layer may be made of chrome (Cr) or chrome oxide.

The first semi-transmitting unit HT1 and the second semi-transmitting unit HT2 may be formed by disposing at least one material 17b selected from a group consisting of CrxOy, CrxCoy, CrxCoyNz, SizNy, and combinations thereof (herein, suffix x, y, and z are natural numbers, each representing the number of chemical elements) on the transparent base 20 on which the first and second light blocking units 19a and 19b are formed. As shown in FIG. 3D, the material of the first semi-transmitting unit HT1 and the second semi-transmitting unit HT2 may cover the first and second light blocking units 19a and 19b.

Figure 9:
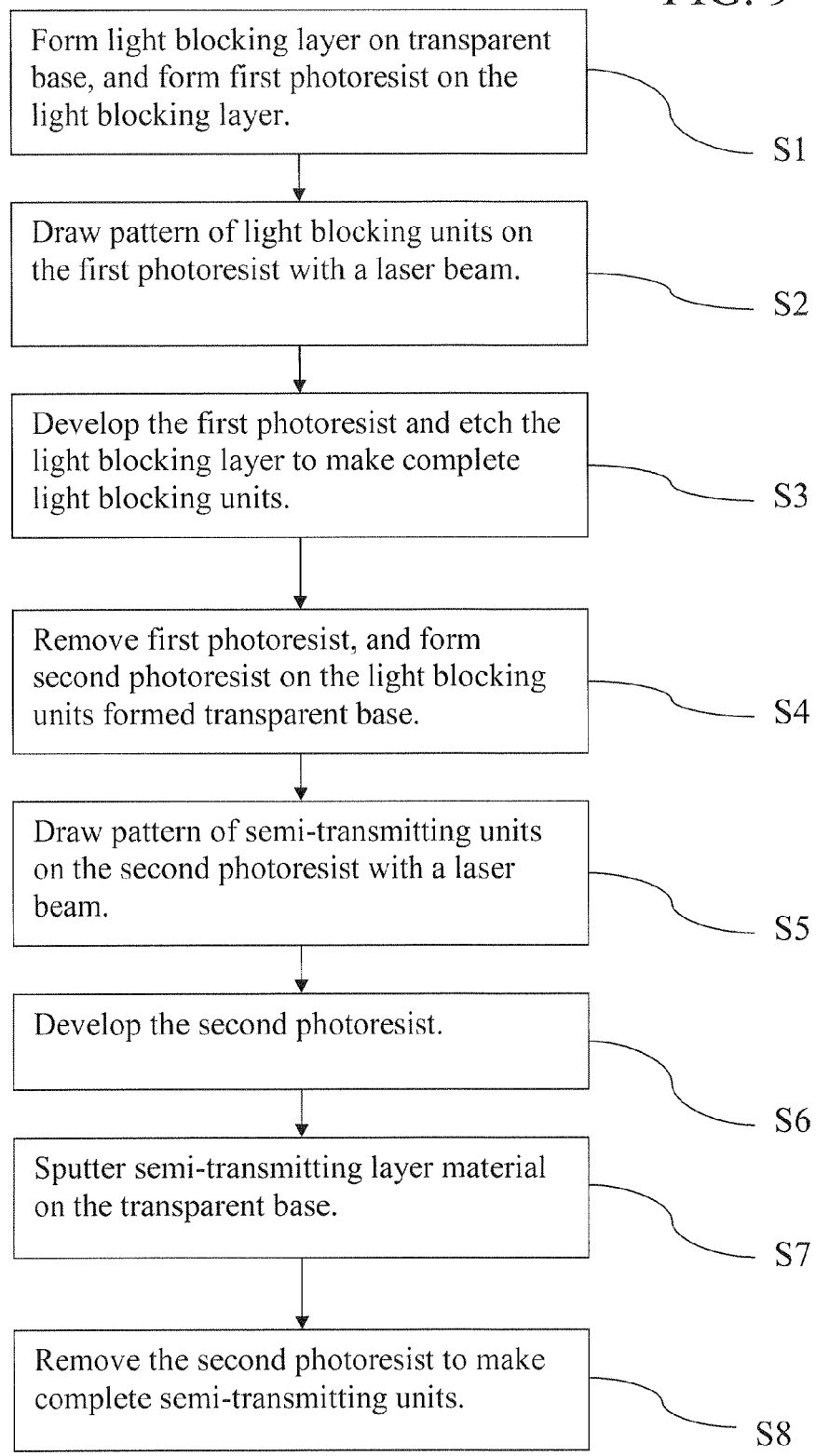
FIG. 9 shows a flow chart for manufacturing a halftone mask.

FIG. 9 shows a flow chart for manufacturing a halftone mask The manufacturing method of the halftone mask 10d of the present embodiment is briefly explained referring to FIG. 9. First, a light blocking layer formed of Cr or CrO2 and a first photoresist having positive characteristics are formed sequentially on the transparent base 20 (S1) and a laser beam is emitted from the upper side of the first photoresist, thereby drawing a desired pattern on the first photoresist (S2).

Next, the first photoresist is developed to remove the portion which is exposed to the laser beam. The light blocking layer exposed to the outside through the removal of the first photoresist is etched, thereby forming a first light blocking unit 19a and a second light blocking unit 19b (S3).

Next, the first photoresist is completely removed and a second photoresist having positive characteristics is formed on the transparent base 20 on which the first and second light blocking units 19a and 19b are formed (S4).

Next, a pattern corresponding to semi-transmitting units HT1 and HT2 is drawn on the second photoresist with a laser beam (S5). The second photoresist is developed to remove the portion which is exposed to the laser beam (S6).

Next, semi-transmitting layer material is sputtered on the transparent base 20 exposed to the outside through the removal of the second photoresist and the remaining second photoresist (S7). The semi-transmitting material formed on the second photoresist is removed together with the remaining second photoresist (S8).

The portion, on which the semi-transmitting layer material is disposed, is formed into the semi-transmitting units HT1 and HT2. The semi-transmitting units HT1 and HT2, which can reduce intensity light, may be implemented with various materials other than chrome or chrome oxide, and may have various structures, having no limitation in light transmission. For example, the semi-transmitting units HT1 and FIT2 may reduce the intensity of light by about 90% to 10%.

The wavelength range of the light may vary according to an exposure device so that it is not limited, while a wavelength range of about 300 to 400 nm may be generally used.

Figure 4A:
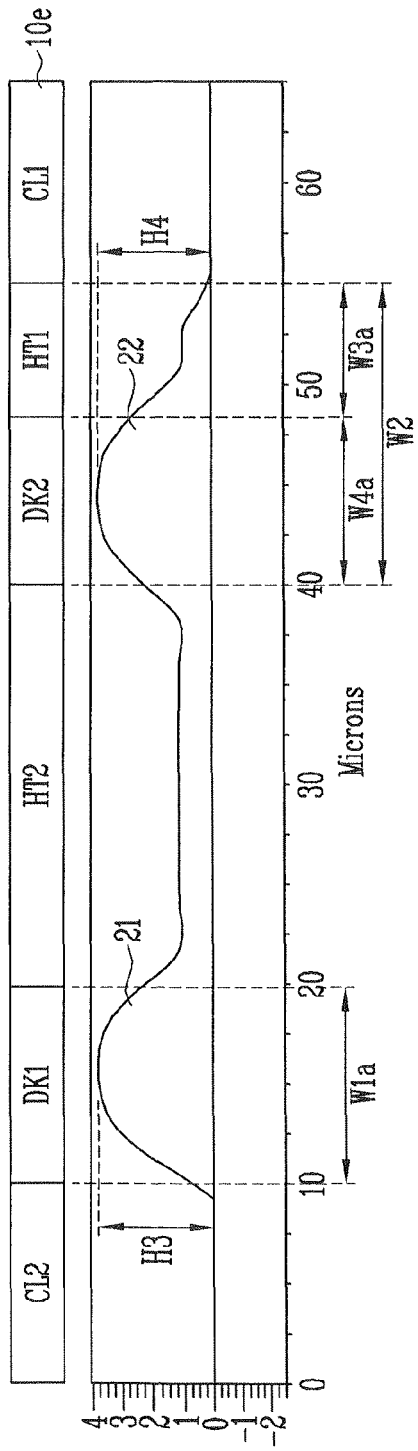
FIGS. 4A and 4B are diagrams showing layouts of halftone masks according to an embodiment of the present invention and profiles of underlying layers corresponding thereto.
Figure 4B:
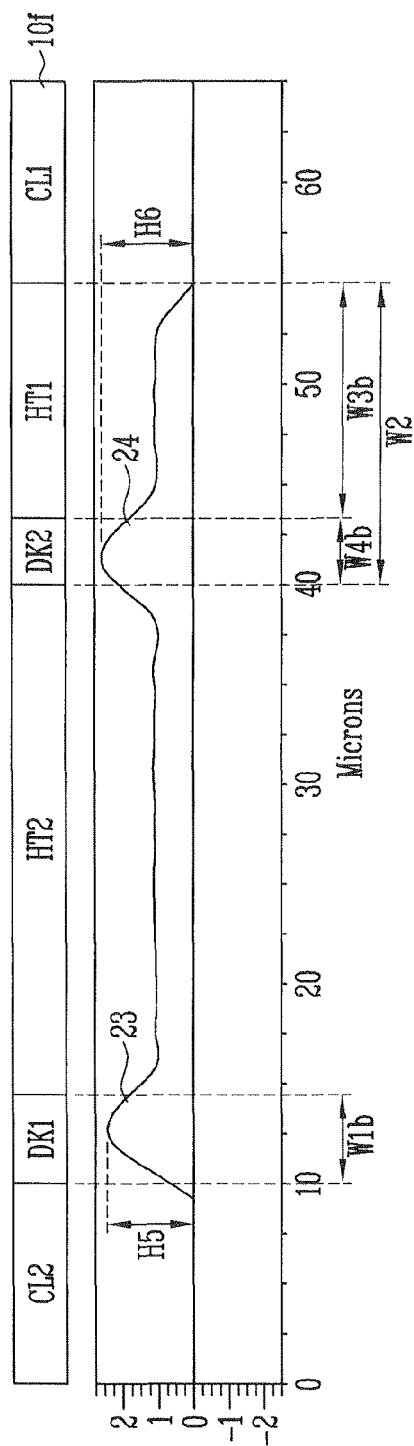
Figure 5A:
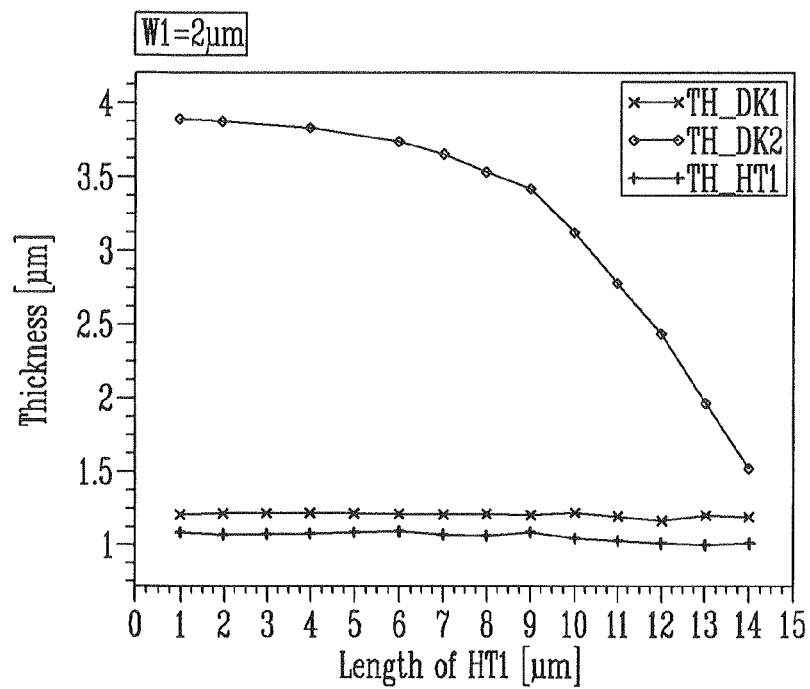
FIGS. 5A to 5G are graphs showing the changes in heights of first and second light blocking units according to the changes in lengths of the first light blocking unit and semi-transmitting unit of the halftone mask according to the present invention.
Figure 5B:
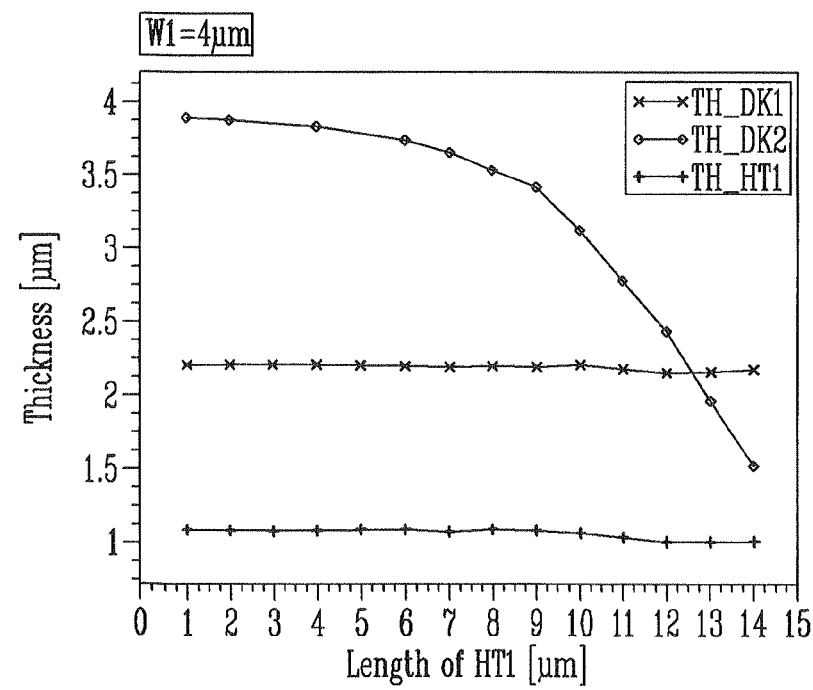
Figure 5C:
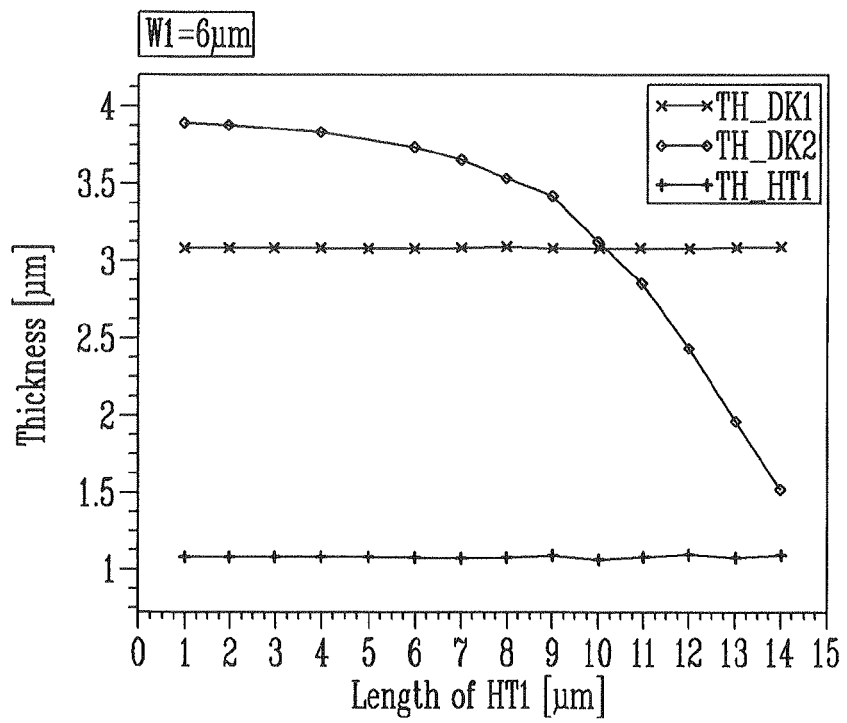
Figure 5D:
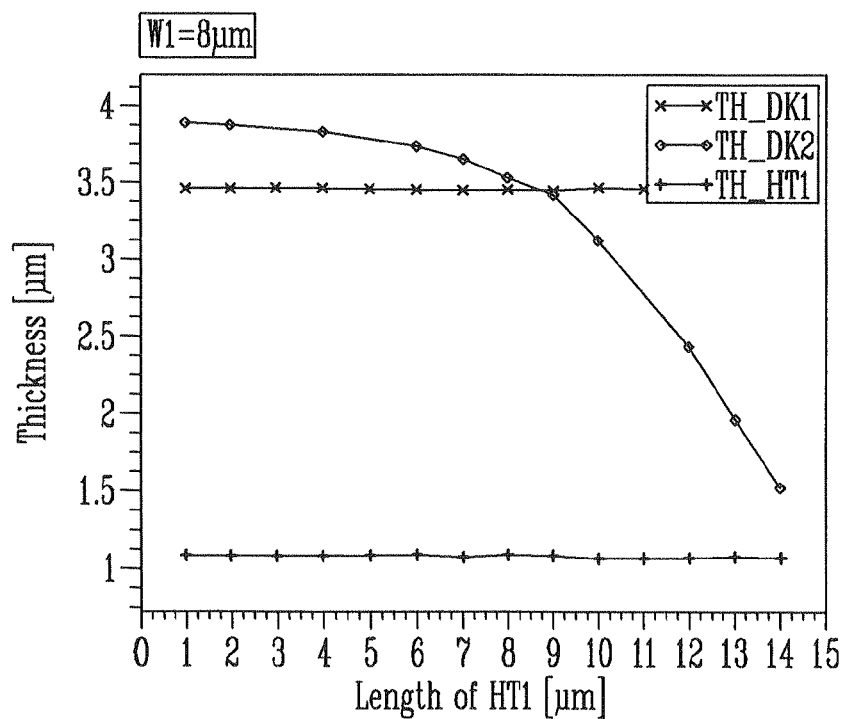
Figure 5E:
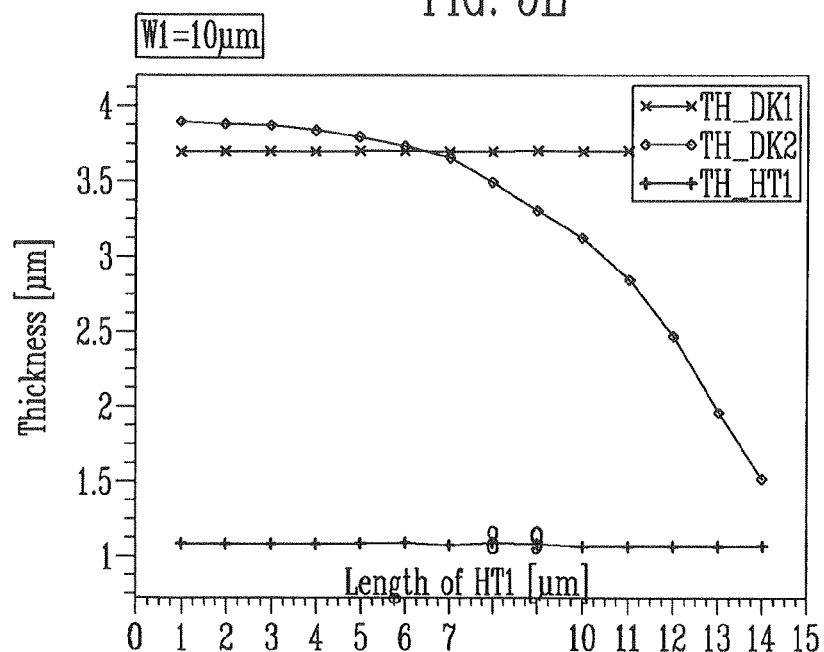
Figure 5F:
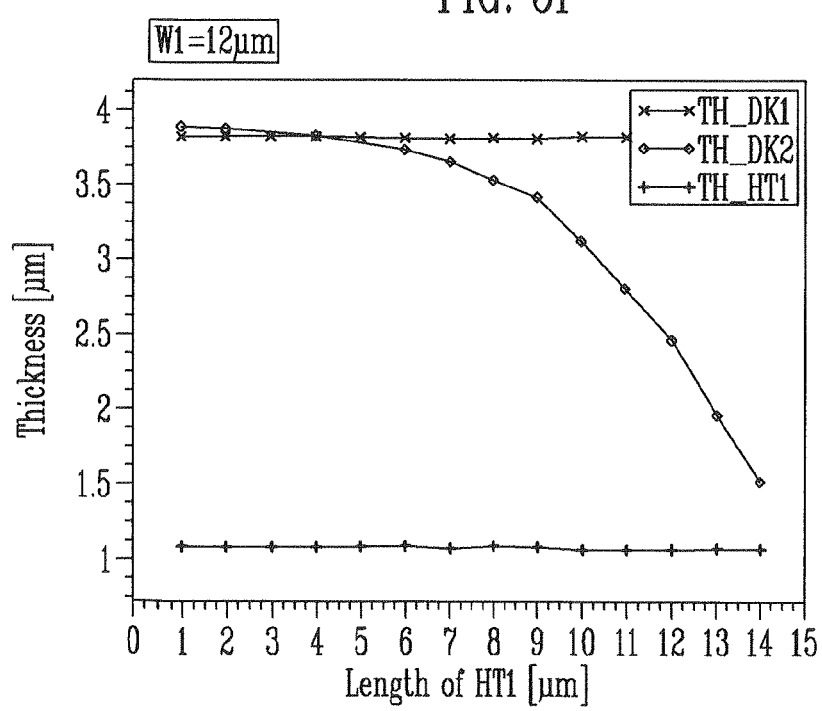
Figure 5G:
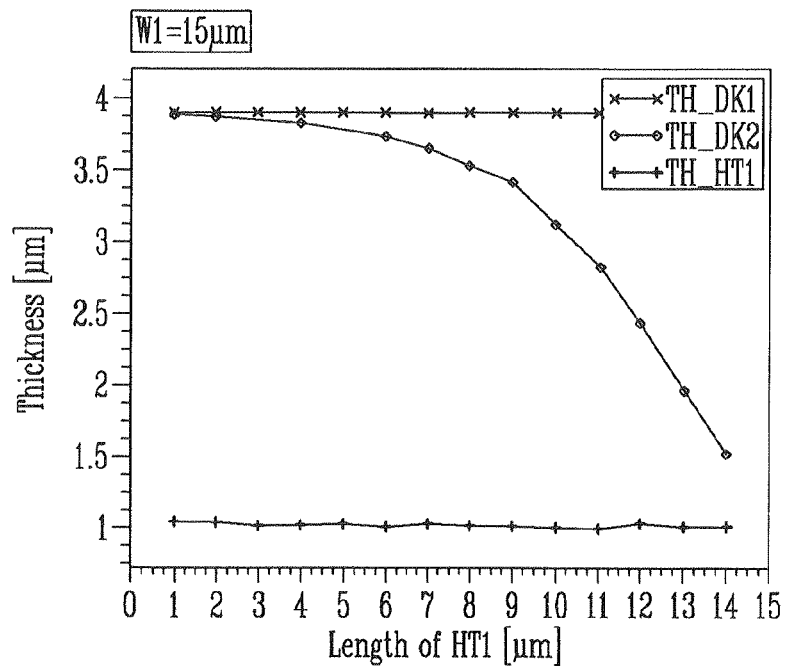

FIGS. 4A and 4B are diagrams showing layouts of halftone masks according to the present invention and profiles of underlying layers corresponding thereto. As shown in FIG. 4A, the respective heights (or thicknesses) H3 and H4 of the two regions 21 and 22 of the underlying layer patterned using a halftone mask 10e of the present embodiment are substantially the same. Actually, the thicknesses H3 and H4 of the two underlying layer regions are substantially the same in an error range of −0.01 μm to 0.01 μm based on the thickness of 3.65 μm. The two regions 21 and 22 of the underlying layer correspond to the first light blocking unit DK1 and the second light blocking unit DK2 of the halftone mask 10e, respectively.

Similarly, as shown in FIG. 4B, the heights (or thicknesses) H5 and H6 of the two regions 23 and 24 of the underlying layer patterned using a halftone mask 10f of the present embodiment are substantially the same. Actually, the thicknesses H5 and H6 of the two underlying layer regions are substantially the same in an error range of −0.01 μm to 0.01 μm based on the thickness of 2.15 μm. The two regions 23 and 24 of the underlying layer correspond to the first light blocking unit DK1 and the second light blocking unit DK2 of the halftone mask 10f, respectively.

In the two halftone masks 10e and 10f, the length of the first light blocking unit DK1 of the mask 10f is reduced to W1b from W1a of the mask 10e. The length of the first semi-transmitting unit HT1 disposed next to the second light blocking unit DK2 of the mask 10f is increased to W3b from W3a of the mask 10e. As described above, in the halftone mask of the present embodiment, when the length of the first light blocking unit DK1 is relatively small, the length of the semi-transmitting unit HT1 is relatively large, and when the length of the first light blocking unit DK1 is relatively large, the length of the semi-transmitting unit HT1 is relatively small. Meanwhile, the sum of the length W4a of the second light blocking unit DK2 and the length W3a of the semi-transmitting unit W3a of the halftone mask 10e is the same as the sum of the length W4b of the second light blocking unit DK2 and the length W3b of the semi-transmitting unit W3b of the halftone mask 10f. In the mask having two light blocking units spaced apart from each other and having different lengths, the semi-transmitting unit is installed on one side of the light blocking unit having a relatively long length, of the two light blocking units.

FIGS. 5A to 5G are graphs showing the changes in heights of underlying layers corresponding to the first and second light blocking units as a function of the changes in lengths of the first light blocking unit and first semi-transmitting unit of the halftone mask according to the present invention.

Halftone masks used in the embodiments hereinafter are substantially the same as the halftone mask 10e or 10f shown in FIG. 4A or 4B, excepting for the feature that the lengths of the first and second light blocking units and the length of the first semi-transmitting unit vary. In FIGS. 5A to 5G, the thickness of the underlying layer corresponding to the first light blocking unit DK1 is represented by TH_DK1, the thickness of the underlying layer corresponding to the second light blocking unit DK2 is represented by TH_DK2, and the thickness of the underlying layer corresponding to the semi-transmitting unit HT1 is represented by TH_HT1.

The graphs of FIGS. 5A to 5G shows thicknesses TH_DK1, TH_DK2, and TH_HT1 of the underlying layer, when the lengths W1 of the first light blocking units DK1 were 2 μm, 4 μm, 6 μm, 8 μm, 10 μm, 12 μm, and 15 μm, respectively. The length of the semi-transmitting unit HT1 was increased by 1 μm from 1 μm to 14 μm.

As a result of the measurement, when W1=2 μm, TH_DK1 was about 1.25 μm, when W1=4 μm, TH_DK1 was about 2.25 μm, when W1=6 μm, TH_DK1 was about 3.10 μm, when W1=8 μm, TH_DK1 was about 3.50 μm, when W1=10 μm, TH_DK1 was about 3.70 μm, when W1=12 μm, TH_DK1 was about 3.80 μm, and when W1=15 μm, TH_DK1 was about 3.90 μm. TH_DK1 was about 1.1 μm, almost irrespective of the length W1 of the first light blocking unit DK1. When the length of the semi-transmitting unit HT1 is increased by 1 μm from 1 μm to 4 μm, TH_DK2 is reduced from about 3.90 μm to 1.55 μm.

As shown in FIGS. 5A to 5G, it can be appreciated that when the length W1 of the first light blocking unit DK1 has a predetermined size, there is a predetermined length of the semi-transmitting unit HT1 that can make TH_DK1 and TH_DK2 the same.

Meanwhile, although not shown in the drawing, if W1 is smaller than 2 μm, TH_DK1 and TH_DK2 may be the same by making the length of the semi-transmitting unit HT1 larger (for example, about 0.02 to 0.03 μm) than 14 m from the range of 14 μm to 15 μm.

By way of example, when the maximum set height of the underlying layer is about 25 μm, if W1 is 15 μm or more, TH_DK1 and TH_DK2 may be substantially the same by making the length of the semi-transmitting unit HT1 somewhat smaller (for example, about 0.01 to 0.03 μm) than about 2 μm by the height that W1 exceeds 15 μm.

The experimental example as described above is examples for one embodiment having a predetermined defocus value in a predetermined exposure device using a predetermined light, but the length of the first light blocking unit DK1 and the length of the semi-transmitting unit HT1 of the halftone mask, together with the height of the underlying layer, intended to be formed, may naturally be controlled within a predetermined range, according to the wavelength-range of the emitted light, the sort of the exposure device, and the defocus degree.

Figure 6:
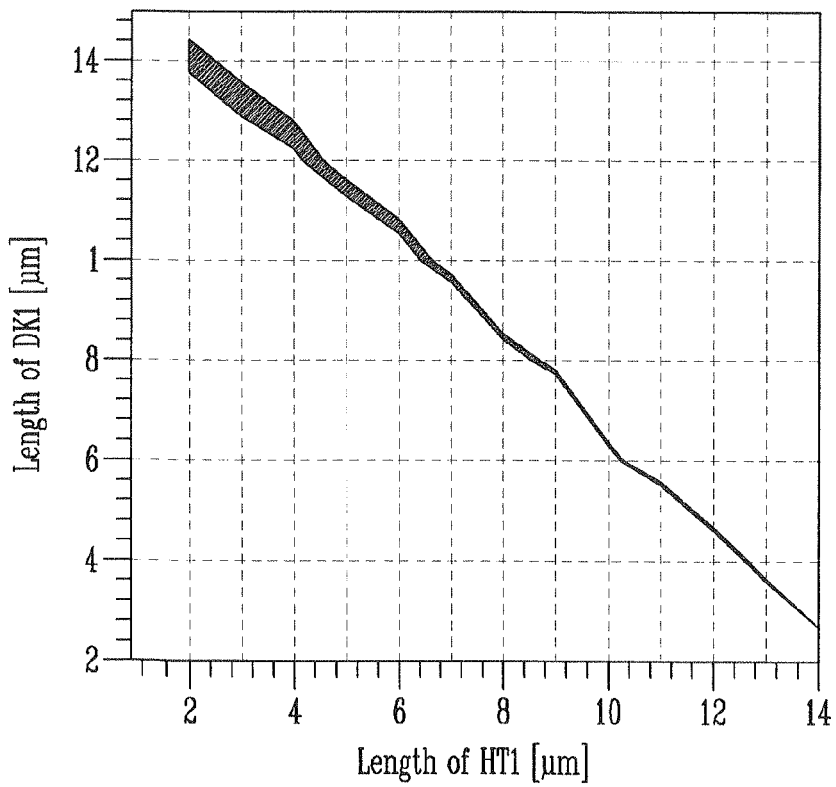
FIG. 6 is a graph showing the length relationship between the first light blocking unit and semi-transmitting unit of the halftone mask according to the present invention.

FIG. 6 is a graph showing the length relationship between the first light blocking unit and the first semi-transmitting unit of the halftone mask, which makes the heights of the respective underlying layers the same, according to the present invention. As shown in FIG. 6, in the respective halftone masks in the embodiments, the length of the first light blocking unit DK1 is in inverse proportion to the length of the semi-transmitting unit HT1.

The graph in FIG. 6 including the experimental results of FIGS. 5A to 5G shows that in the process of forming a film using the halftone mask of the present embodiment, in order to form the film having the same heights on the lower parts of the two light blocking units spaced apart from each other and having different heights, when one portion of the light blocking unit having a relatively larger length of the two light blocking units is replaced by the semi-transmitting unit, the length of the semi-transmitting unit is formed at a predetermined range (a portion marked in the graph of FIG. 6) in inverse proportion to the size of the length of the light blocking unit DK1 having a relatively small length, thereby making it possible to make the target heights of the two underlying layer regions constant.

Figure 10:
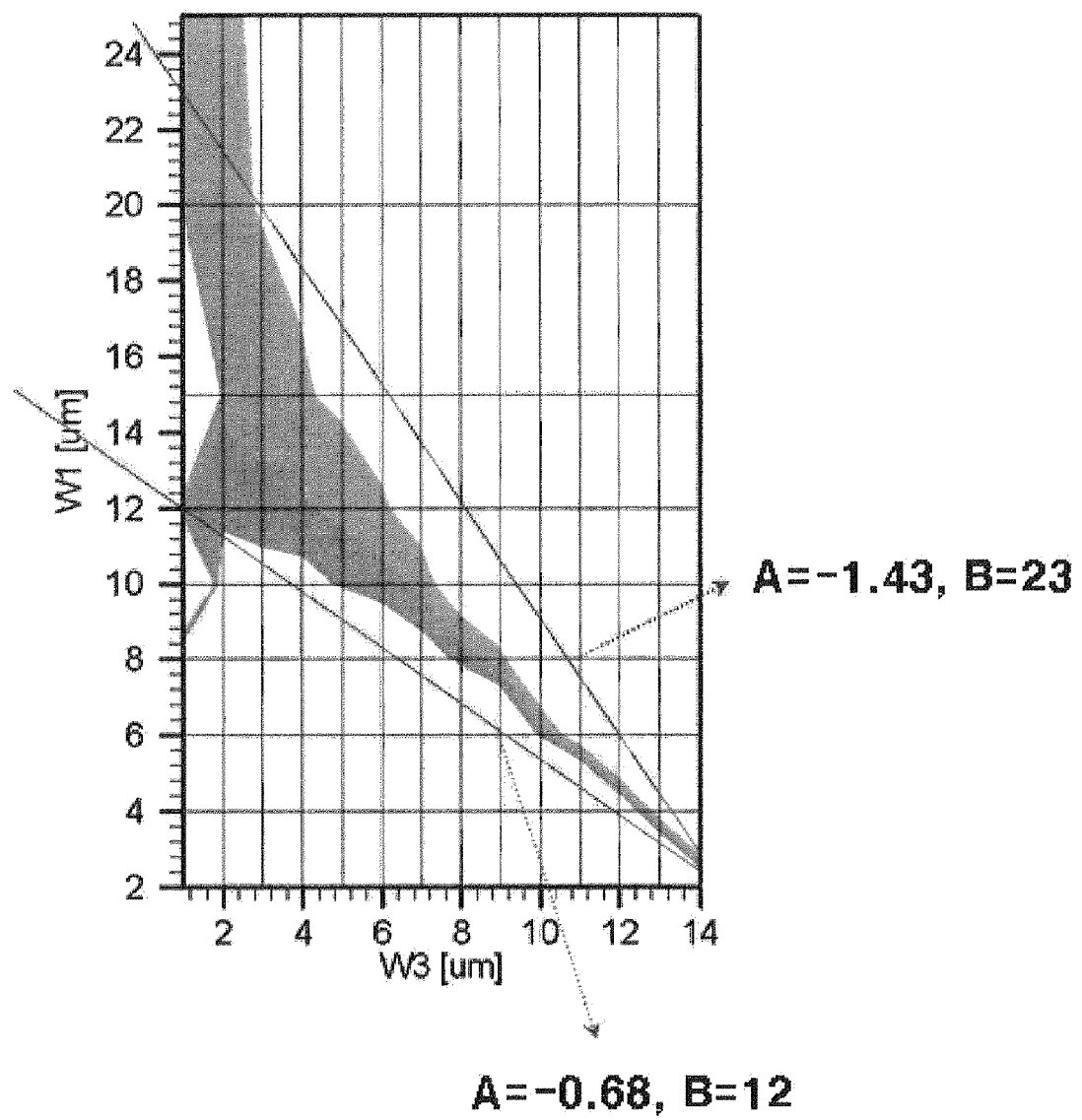
FIG. 10 is a graph showing a relationship between the first length W1 (the length of the first light blocking unit DK1) and the third length W3 (the length of the semi-transmitting unit HT1) in an extended range.

FIG. 10 is a graph showing a relationship between the first length W1 (the length of the first light blocking unit DK1) and the third length W3 (the length of the semi-transmitting unit HT1) in an extended range, which can be applied to the present embodiment. This range is found through experiments and is acceptable to the present embodiment. FIG. 10 shows two lines that defines an acceptable range of the first length W1 and the third length W3. The first length W1 and the third length W3 has a relationship of W1=A·W3+B. The upper line represents a line of W1=−1.43 W3+23, and the lower line represents a line of W1=−0.68 W3+12. In the present embodiment, the first length W1 and the third length W3 are determined in the range bounded by these upper and lower lines. In other words, the first length W1 and the third length W3 have a relationship of W1=A·W3+B, where A is a number in a range from −0.68 to −1.43 (−1.43≦A≦−0.68), and B is a number in a range from 12 to 23 (12≦B≦23).

Figure 7A:
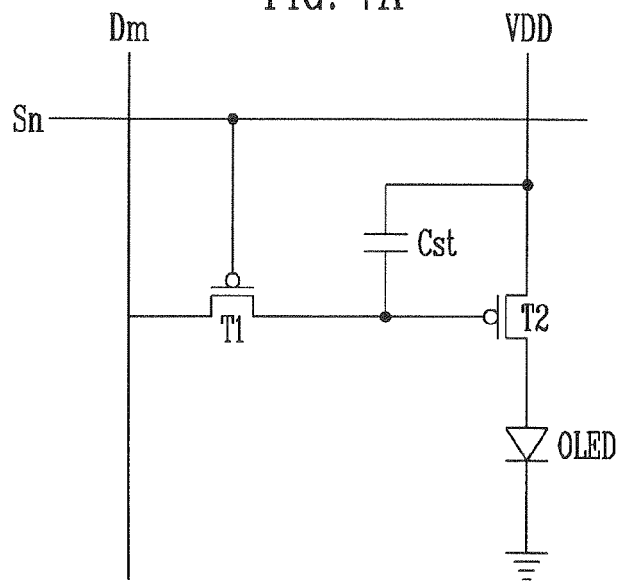
FIG. 7A is a pixel circuit view explaining an example of an organic light emitting display device to which a method for forming a film according to the present invention is applied.
Figure 7B:
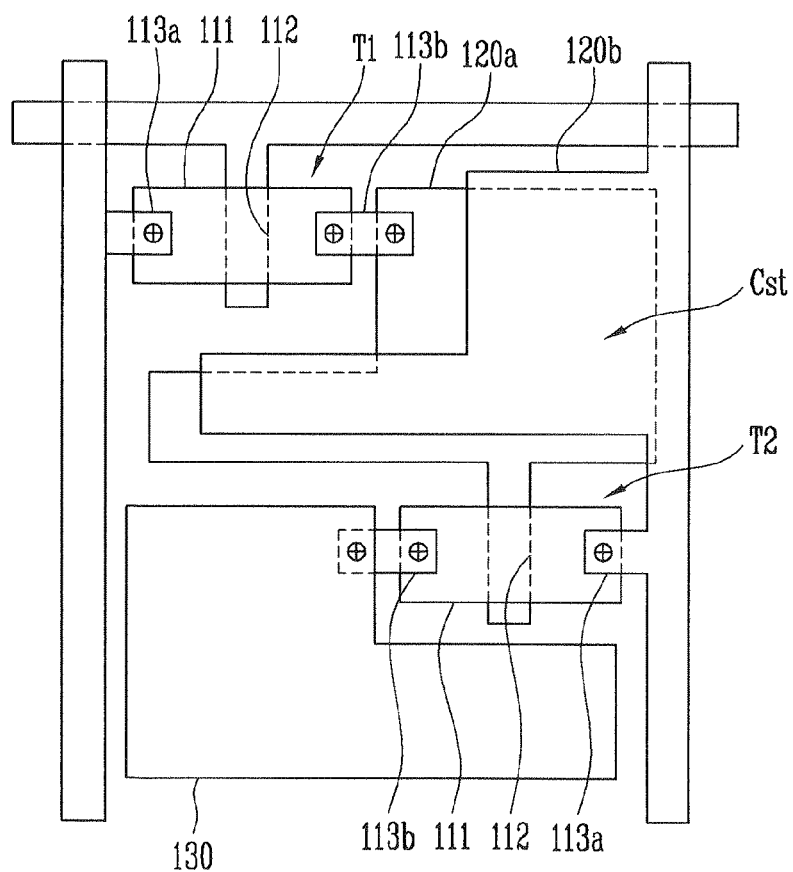
FIG. 7B is a plan view showing one example of a pixel structure wherein the pixel circuit of FIG. 7A is implemented.

FIG. 7A is a pixel circuit view explaining an example of an organic light emitting display device to which a method for forming a film according to the present invention is applied. FIG. 7B is a plan view showing one example of a pixel structure wherein the pixel circuit of FIG. 7A is implemented. Referring to FIG. 7A, the organic light emitting display device in an active matrix scheme basically includes two transistors T1 and T2 and one capacitor Cst. In other words, the organic light emitting display device includes a switching transistor T1 that transfers a data signal on a data line Dm in response to a selection signal on a scan line Sn, a capacitor Cst that stores the data signal received through the switching transistor T1, a driving transistor T2 connected to a power supply line VDD to generate driving current according to the data signal stored in the capacitor Cst, and an organic light emitting diode OLED that performs a light emission operation according to the driving current.

Referring to FIG. 7B, the respective transistors Ti and T2 of the organic light emitting display device include a semiconductor layer 111, a gate electrode 112, source/drain electrodes 113a and 113b, respectively. The capacitor Cst includes a lower electrode 120a and an upper electrode 120b opposed to each other. The source/drain electrode 113b on one side of the driving transistor T2 is coupled to a first electrode 130. The organic light emitting diode is coupled between the first electrode and a second electrode (or a ground electrode) in series.

When manufacturing the organic light emitting display device having the pixel structure, a pixel defining layer is formed on the upper part of the first electrode 130. At this time, if any one of halftone masks in the embodiments is used, the heights of the two pixel defining layers adjacent to the pixel region at least in one direction can be formed to be constant.

Figure 8A:
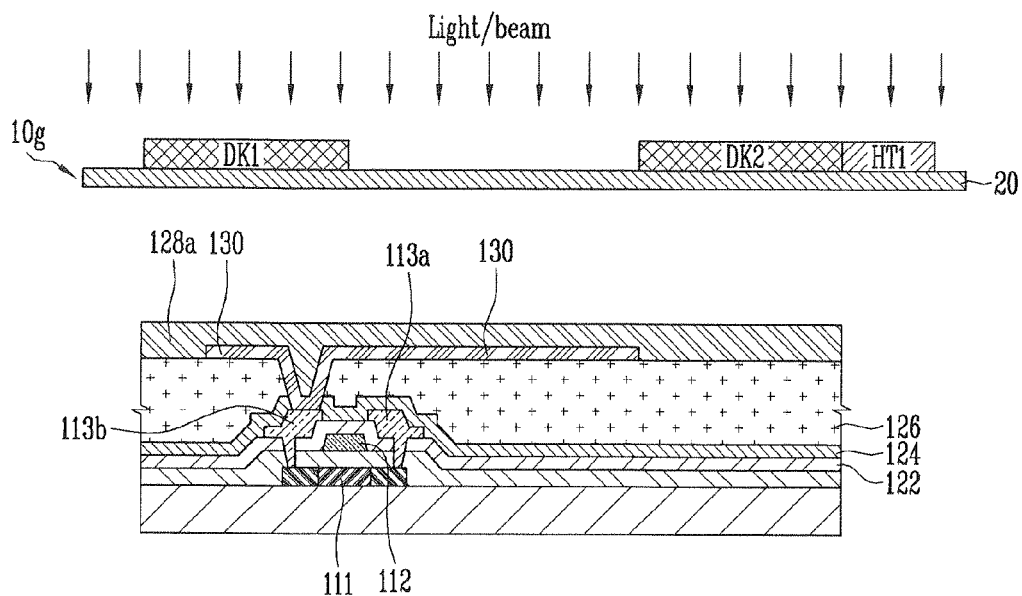
FIGS. 8A to 8C are cross-sectional views explaining manufacturing processes of the organic light emitting display device to which the method for forming the film according to the present invention is applied.
Figure 8B:
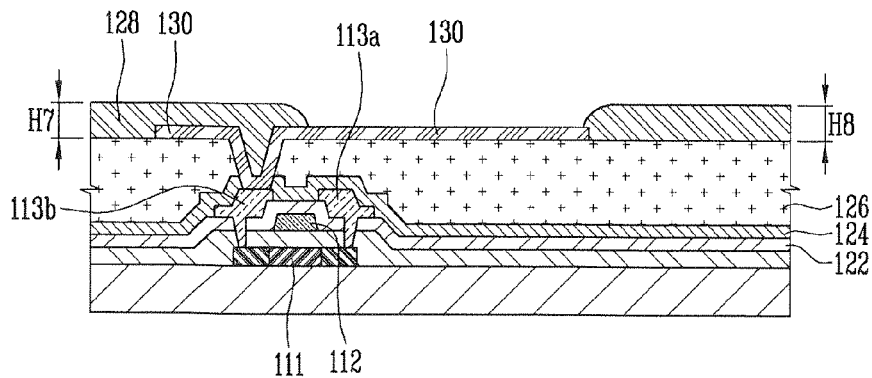
Figure 8C:
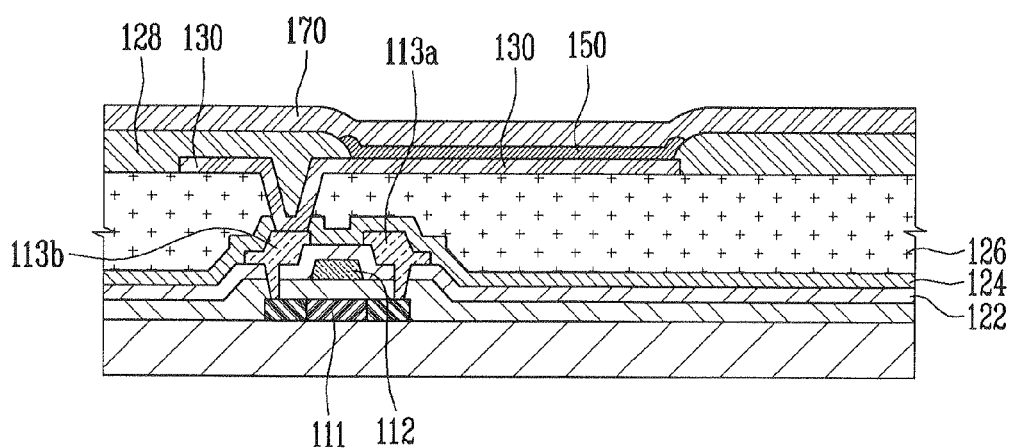

FIGS. 8A to 8C are cross-sectional views explaining manufacturing processes of the organic light emitting display device to which the method for forming the film according to the present invention is applied. As shown in FIG. 8A, a pixel defining layer may be formed on a substrate structure using a halftone mask 10g of the present embodiment. In other words, the material 128a for forming the pixel defining layer coated on the substrate structure is exposed through the halftone mask 10g so that a partial region of the first electrode 130 positioned on the upper part of the substrate structure is exposed to be used as a pixel region.

The substrate structure may be provided by sequentially forming a buffer layer (not shown), a semiconductor layer 111, a gate insulating film 120, a gate electrode 112, an interlayer insulating film 122, source/drain electrodes 113a and 113b coupled to the source/drain regions on both ends of the semiconductor layer 111 by penetrating through the interlayer insulating layer 122, a protective film 124, a planarization film 126, a first electrode 130 coupled to the source/drain electrode 113b on one side by penetrating through the planarization layer 126 and the protective film 124 on a insulating substrate 100 made of glass or plastic material.

As shown in FIG. 8B, in a pixel defining layer 128 provided by selectively transmitting ultraviolet rays using the halftone mask 10g, the heights H7 and H8 of the two regions positioned on both sides of the pixel region where an organic layer 150 (in FIG. 8C) is to be formed become substantially the same.

As shown in FIG. 8C, an organic layer 150 having desired structure and pattern and a second electrode 170 are formed on the structure where the pixel defining layer 128 on which the pixel region is exposed is provided. At this time, if the pixel defining layer 128 having the heights substantially the same on both sides of the pixel region is used, it can prevent a deposition defect from being generated when depositing organic material for the organic layer 150 or when depositing an electrode for the second electrode 170 on the structure where the organic layer 150 is formed.

As described above, if the halftone mask of the present embodiment is used, the organic light emitting display device having excellent reliability and durability can be manufactured.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A halftone mask comprising:
a first light blocking unit having a first length and blocking light;
a second light blocking unit having a second length and blocking light, the first and second light blocking units being spaced apart lengthwise from each other at a predetermined interval; and
a first semi-transmitting unit having a third length and disposed substantially next to the second light blocking unit in a manner that the second light blocking unit is disposed between the first semi-transmitting unit and the first light blocking unit, the first semi-transmitting unit reducing intensity of light passing through the halftone mask, a sum of the second length and the third length being larger than the first length.

2. The halftone mask as claimed in claim 1, wherein the third length is determined in an inverse proportion to the first length of the first light blocking unit while maintaining the sum of the second length and the third length.

3. The halftone mask as claimed in claim 1, wherein the first length and the third length have a relationship of W1=A·W3+B, where W1 is the first length, W3 is the third length, A is a number in a range from −0.68 to −1.43, and B is a number in a range from 12 to 23.

4. The halftone mask as claimed in claim 1, further comprising a light transmitting unit transmitting light or a second semi-transmitting unit disposed between the first light blocking unit and the second light blocking unit.

5. The halftone mask as claimed in claim 4, wherein the light transmitting unit and the second semi-transmitting unit have different light transmittances.

6. The halftone mask as claimed in claim 1, wherein the first semi-transmitting unit is made of the same material as the second light blocking unit, the first semi-transmitting unit having slits, light passing through the slits.

7. The halftone mask as claimed in claim 1, wherein each of the first light blocking unit and the second light blocking unit includes a light shielding layer disposed on a transparent base.

8. The halftone mask as claimed in claim 7, wherein the light shielding layer includes chrome (Cr) or chrome oxide.

9. The halftone mask as claimed in claim 7, wherein the first semi-transmitting unit includes one selected from the group consisting of CrxOy, CrxCoy, CrxCoyNz, SizNy, and combinations thereof, 'x', 'y', and 'z' being natural numbers.

10. A manufacturing method of a halftone mask, comprising:
    forming a first light blocking unit having a first length and a second light blocking unit having a second length, the first and second light blocking units blocking light, the first and second light blocking units being spaced apart lengthwise from each other at a predetermined interval; and
    forming a first semi-transmitting unit having a third length, the first semi-transmitting unit being disposed substantially next to the second light blocking unit in a manner that the second light blocking unit is disposed between the first semi-transmitting unit and the first light blocking unit, the first semi-transmitting unit reducing intensity of light passing through the halftone mask, a sum of the second length and the third length being larger than the first length.

11. The manufacturing method of the halftone mask as claimed in claim 10, wherein the third length is determined in an inverse proportion to the first length while maintaining the sum of the second length and the third length.

12. The manufacturing method of the halftone mask as claimed in claim 10, further comprising forming a second semi-transmitting unit or a light transmitting unit between the first light blocking unit and the second light blocking unit.

13. The manufacturing method of the halftone mask as claimed in claim 12, wherein the light transmitting unit and the second semi-transmitting unit have different light transmittances.

14. The manufacturing method of the halftone mask as claimed in claim 10, wherein the first semi-transmitting unit includes slits through which light passes.

15. The manufacturing method of the halftone mask as claimed in claim 10, wherein the forming the first light blocking unit and the second light blocking unit comprises forming a light shielding layer on a transparent base.

16. The manufacturing method of the halftone mask as claimed in claim 15, wherein the light shielding unit is made of chrome or chrome oxide.

17. The manufacturing method of the halftone mask as claimed in claim 15, wherein the first semi-transmitting unit includes one selected from the group consisting of CrxOy, CrxCoy, CrxCoyNz, SizNy 'x', 'y', and 'z' being natural numbers.

18. A method for forming a film using a halftone mask, comprising:
    arranging the halftone mask on a underlying layer formed on a substrate, the halftone mask comprising:
    a first light blocking unit having a first length and blocking light;
    a second light blocking unit having a second length and blocking light, the first and second light blocking units being spaced apart lengthwise from each other at a predetermined interval; and
    a first semi-transmitting unit having a third length and disposed substantially next to the second light blocking unit in a manner that the second light blocking unit is disposed between the first semi-transmitting unit and the first light blocking unit, the first semi-transmitting unit reducing intensity of light passing through the halftone mask, a sum of the second length and the third length being larger than the first length;
    emitting light to the underlying layer through the halftone mask; and
    developing the underlying layer, a first height of a first portion of the underlying layer corresponding to the first light blocking unit and a second height of a second portion of the underlying layer corresponding to the second light blocking unit being substantially the same.

19. The method for forming the film as claimed in claim 18, wherein the third length is determined in an inverse proportion to the first length while maintaining the sum of the second length and the third length.

20. The method for forming the film as claimed in claim 18, wherein the underlying layer is made of photosensitive polymer material.

21. The method for forming the film as claimed in claim 18, wherein the film includes a pixel defining layer that covers the upper part of a substrate on which a pixel electrode is formed so that a portion of the pixel electrode of an organic light emitting display device is exposed.

* * * * *